(12) United States Patent  
Gutierrez et al.

(10) Patent No.: US 9,359,795 B1  
(45) Date of Patent: Jun. 7, 2016

(54) MOTION SENSING COMBINATION LOCK

(71) Applicants: Luis A. Gutierrez, Glendale, NY (US); Robert G. Flores, Richmond Hill, NY (US)

(72) Inventors: Luis A. Gutierrez, Glendale, NY (US); Robert G. Flores, Richmond Hill, NY (US)

(*) Notice: Subject to any disclaimer, the term of this patent is extended or adjusted under 35 U.S.C. 154(b) by 121 days.

(21) Appl. No.: 14/246,501

(22) Filed: Apr. 7, 2014

(51) Int. Cl.  
*B60R 25/00* (2013.01)  
*E05B 49/00* (2006.01)

(52) U.S. Cl.  
CPC ..................................... *E05B 49/00* (2013.01)

(58) Field of Classification Search  
None  
See application file for complete search history.

(56) References Cited

U.S. PATENT DOCUMENTS

| | | | |
|---|---|---|---|
| 4,298,792 A * | 11/1981 | Granholm | E05B 49/006 235/375 |
| 5,963,000 A | 10/1999 | Tsutsumi et al. | |
| 6,286,347 B1 | 9/2001 | Frolov | |
| 6,486,793 B1 | 11/2002 | Buccola | |
| 6,644,077 B1 | 11/2003 | Huang | |
| 6,967,587 B2 | 11/2005 | Snell et al. | |
| 7,068,179 B2 | 6/2006 | Snell et al. | |
| 7,310,911 B1 | 12/2007 | Sellman | |
| 7,446,644 B2 | 11/2008 | Schaffzin et al. | |
| 8,141,296 B2 | 3/2012 | Bem | |
| 8,284,018 B2 | 10/2012 | Ibsies | |
| 2008/0072637 A1* | 3/2008 | Padilla | E05B 9/086 70/371 |
| 2013/0293368 A1* | 11/2013 | Ottah | G08B 23/00 340/426.1 |

\* cited by examiner

*Primary Examiner* — Ojiako Nwugo  
(74) *Attorney, Agent, or Firm* — Williams Intellectual Property; Benjamin F. Williams

(57) ABSTRACT

A motion sensing combination lock having a plurality of sensors disposed upon a lock body, each of said plurality of sensors disposed sensible of obstructions imposed most proximal thereto, whereby a touch-free combination code is enterable by position of a user's hand between at least two of the plurality of sensors in a specific sequence to effect touch-free operation of a lock.

10 Claims, 5 Drawing Sheets

MOTION SENSING COMBINATION LOCK

BACKGROUND OF THE INVENTION

Various types of combination locks are known in the prior art. However, what is needed is a motion sensing combination lock that includes a plurality of sensors disposed upon a lock body, each of said plurality of sensors sensible of obstructions rendered most proximal thereto, wherein position of a user's hand or finger, for example, most proximal particular ones of the plurality of sensors over a preset sequence enables entry of a touch-free combination code and, therefore, touch-free operation of a lock.

FIELD OF THE INVENTION

The present invention relates to a motion sensing combination lock, and more particularly, to a motion sensing combination lock that includes a plurality of sensors disposed upon a lock body, each of said plurality of sensors sensible of obstructions rendered most proximal thereto, wherein position of a user's hand or finger, for example, most proximal particular ones of the plurality of sensors over a preset sequence enables entry of a touch-free combination code and, therefore, touch-free operation of a lock.

SUMMARY OF THE INVENTION

The general purpose of the motion sensing combination lock, described subsequently in greater detail, is to provide a motion sensing combination lock which has many novel features that result in a motion sensing combination lock which is not anticipated, rendered obvious, suggested, or even implied by prior art, either alone or in combination thereof.

The present motion sensing combination lock has been devised to enable touch-free entry, or touch-free access, into an area or enclosure, as case may be. The present motion sensing combination lock enables operation of a lock without a user having to effect direct contact with said lock. A touch-free combination code is enterable by interaction with a plurality of sensors disposed upon a lock body, whereby a specific sequential interaction with a sequential number of said plurality of sensors enables operation of the lock.

The motion sensing combination lock is envisioned for use anywhere direct contact with a lock is undesirable, such as in a public restroom, for example. However, additional uses are contemplated, the motion sensing combination lock enabling expedient entry, or access, to a restricted area or enclosure, as case may be.

The present motion sensing combination lock, therefore, includes a lock body having a plurality of sensors disposed thereupon. In the preferred embodiment herein disclosed, the lock body is contemplated as a circular lock body with the plurality of sensors disposed circumferentially thereon. The lock body may have two faces, disposed on either side of a door, for example, or be disposed with a single face on one side of the door (such as when used in stalls in a public restroom, for example). The lock body is contemplated to be substantially the same on each face, therefore the following description is directed to a single face of the lock body, but it should be understood that where the lock body is used with a face disposed on each side of a door, to enable restricted access to both sides of said door, the lock body may be substantially the same on either side.

Each of the plurality of sensors, therefore, is sensible of obstructions rendered proximal thereto. Each of the plurality of sensors is disposed to activate a corresponding one of a plurality of Light Emitting Diodes ("LEDs") disposed upon the lock body when an obstruction is sensed most proximal thereto. Thus imposition of a finger or hand of a user, for example, most proximal one of the plurality of sensors causes illumination of one of a plurality of LEDs signifying the sensor has been "activated"—that is, that the particular sensor has sensed the obstruction most proximally imposed thereto.

Each of the plurality of sensors may operate by detection of an object disposed within a maximum range in front of each of said sensors by means of infrared emissions, by optical recognition—such as when a field of view is completely, or proportionately, obscured for example—or by other optical sensing means known in the art.

A touch-free combination code is therefore enterable by activation of at least two of the plurality of sensors in a specific sequence. Thus, a user is enabled access to an area or enclosure by entering a touch-free combination code to operate the motion sensing combination lock. The touch-free combination code, therefore, may comprise a shape delimited between any number of the plurality of sensors activated according to a specific sequence. For example, a user may activate a first sensor, and then move a hand in a circular clockwise fashion to sequentially activate each of the plurality of sensors to open the lock. Alternately, for example, the user could activate a first sensor and then move a hand in a counterclockwise fashion to sequentially activate each of the plurality of sensors to subsequently engage the lock.

Moreover, additional shapes are contemplated, as settable to maintain a specific, programmable, touch-free combination code. For example, a user may activate a sequence of sensors in the shape of a pentagram, say, starting at a first sensor to sequentially activate five of the plurality of sensors according to the points of a pentagram rendered in the air most proximal each of five of the plurality of sensors. Alternately, each of the plurality of LEDs may be enumerated, or illuminate a number, whereby a numerical code is enterable and illuminable when sequentially relevant sensors are activated.

It is contemplated that the plurality of sensors may change color subsequent activation to visibly signal entry of a correct and alternately an incorrect touch-free combination code. Thus, the plurality of sensors may illuminate yellow during activation, for example, and turn green upon successful entry of the respective touch-free combination code. Said plurality of LEDs may alternately turn to red if an incorrect touch-free combination code is entered, for example. Additional color changes to signal operation of the motion sensing combination lock are contemplated.

To program a respective touch-free combination code into a particular motion sensing combination lock, a touch-free override code is contemplated. The touch-free override code is enterable to enable setting of a new touch-free combination code. The touch-free override code may include, for example, entering the touch-free combination code twice in a row, or may include a separate code enterable to program a new code into the device, for example.

For use of the motion sensing combination lock in public restroom stalls, and elsewhere as desired, a manual mechanism may be included to effect manual operation of the lock, whereby a user is enabled manual operation of the lock, as desired, should the touch-free combination code be ineffective, or to enable egress without having to input a touch-free combination code.

Thus has been broadly outlined the more important features of the present motion sensing combination lock so that the detailed description thereof that follows may be better understood and in order that the present contribution to the art may be better appreciated.

Objects of the present motion sensing combination lock, along with various novel features that characterize the invention are particularly pointed out in the claims forming a part of this disclosure. For better understanding of the motion sensing combination lock, its operating advantages and specific objects attained by its uses, refer to the accompanying drawings and description.

BRIEF DESCRIPTION OF THE DRAWINGS

Figures

DETAILED DESCRIPTION OF THE DRAWINGS

Figure 1:
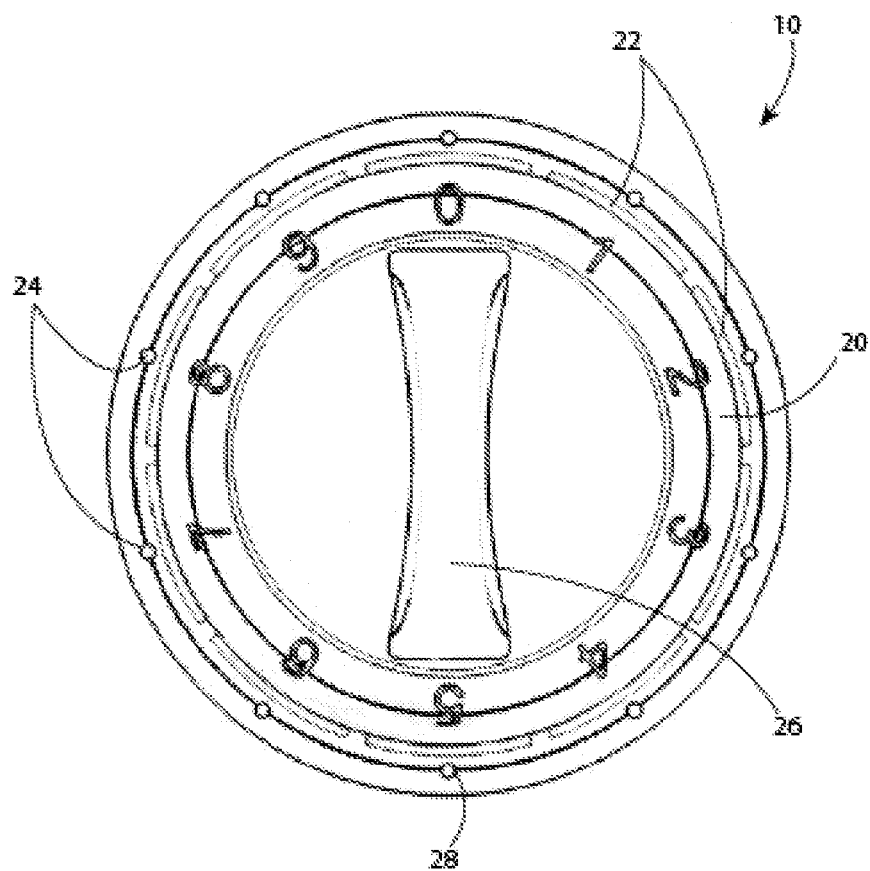
FIG. 1 is a front view of a lock body.
Figure 2:
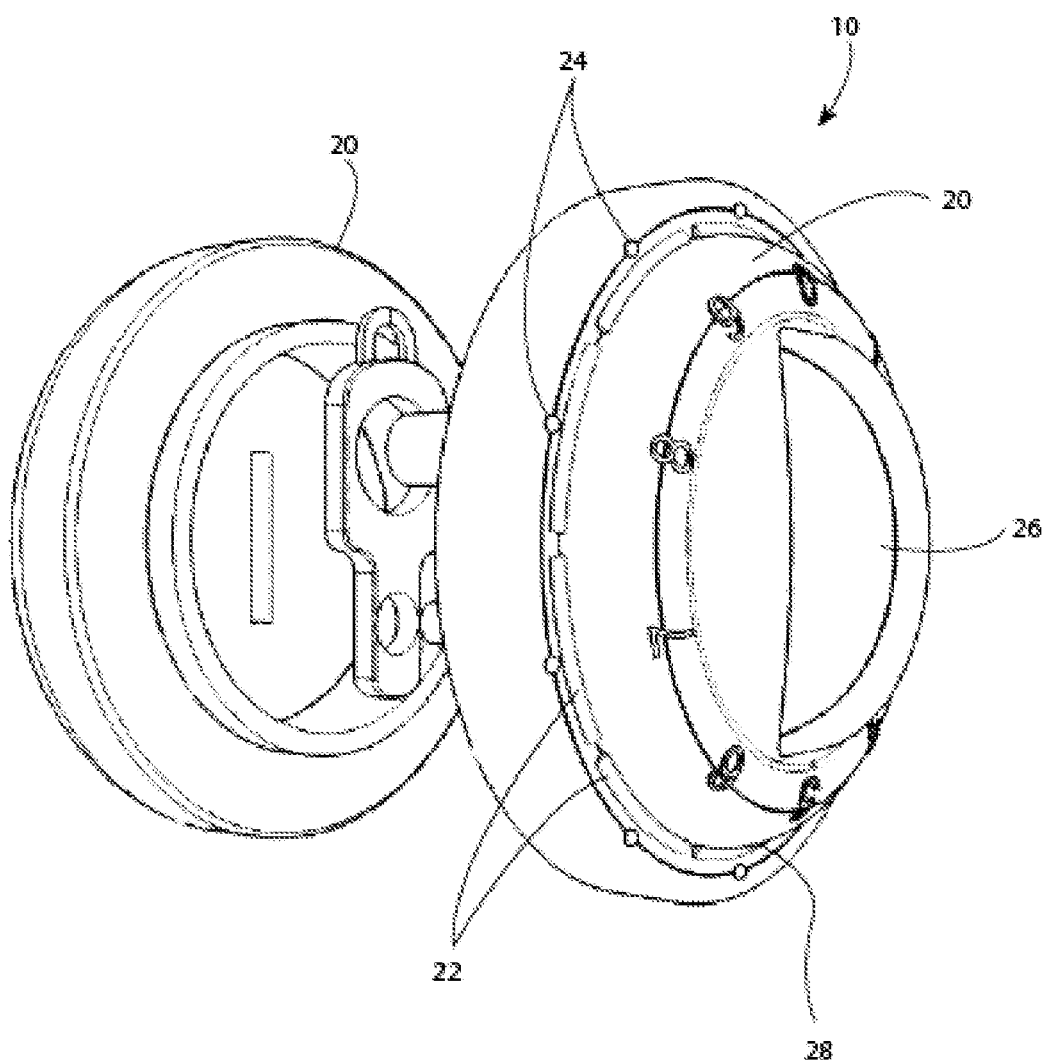
FIG. 2 is an isometric exploded view of a lock body.
Figure 3:
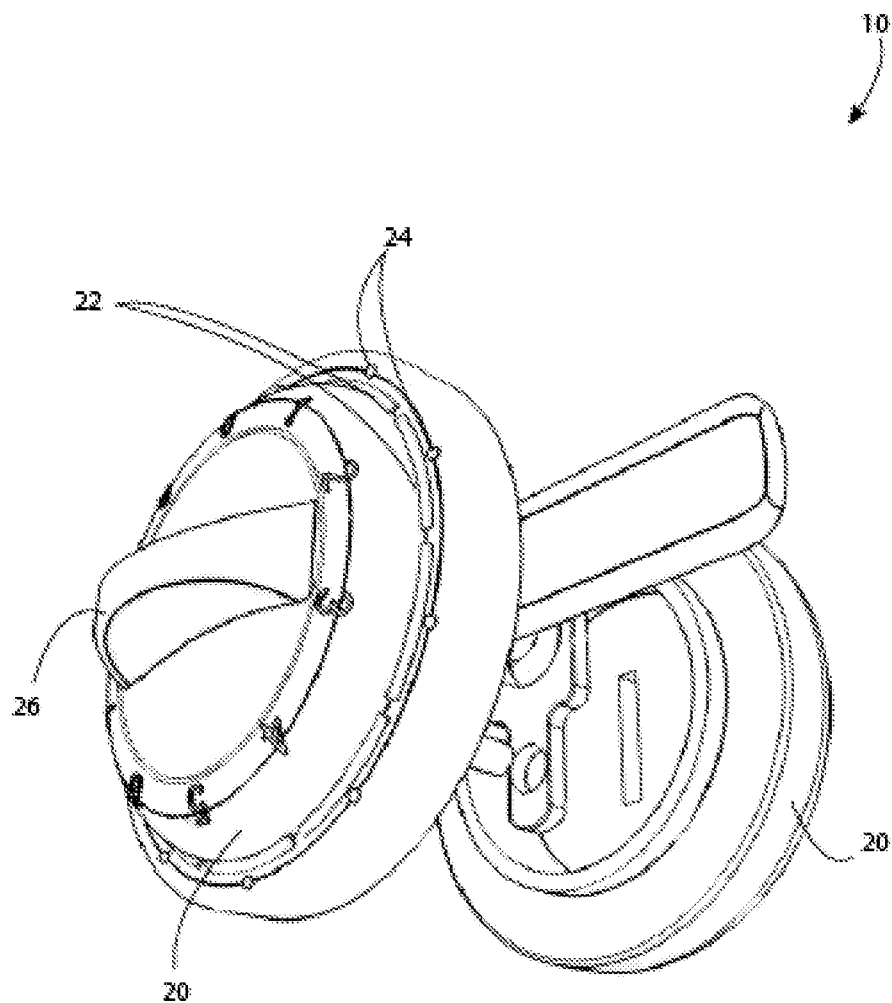
FIG. 3 is an isometric exploded view of a lock body.
Figure 4:
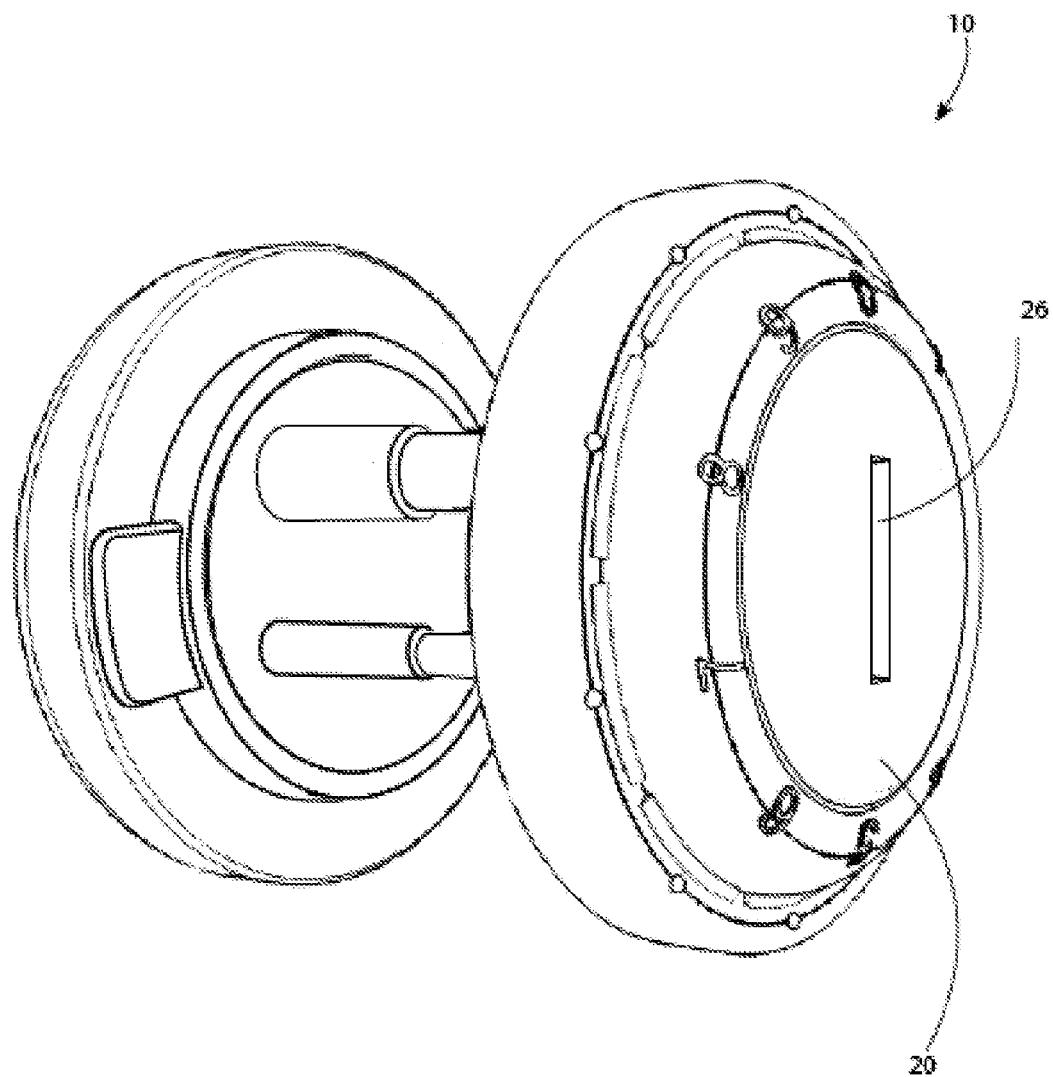
FIG. 4 is rear view of a lock body installed upon a door.
Figure 5:
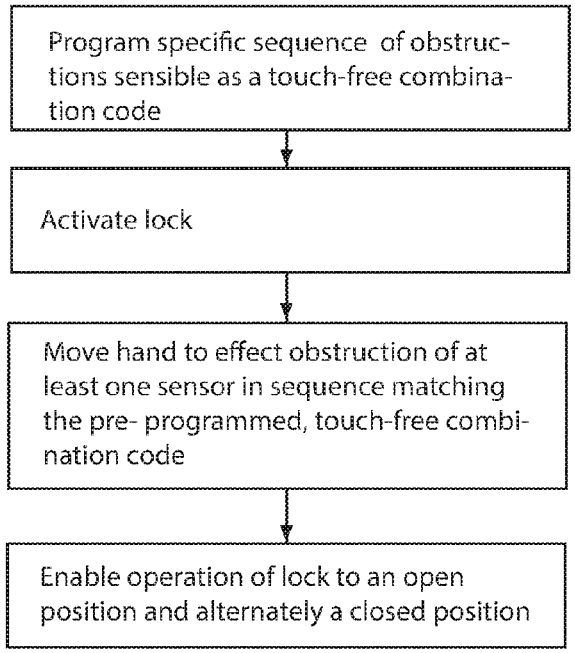
FIG. 5 is a flow chart of an example embodiment of the method effecting operation of a touch-free combination lock by manual action effected proximal the lock body in range of a plurality of sensors.
Figure 6:
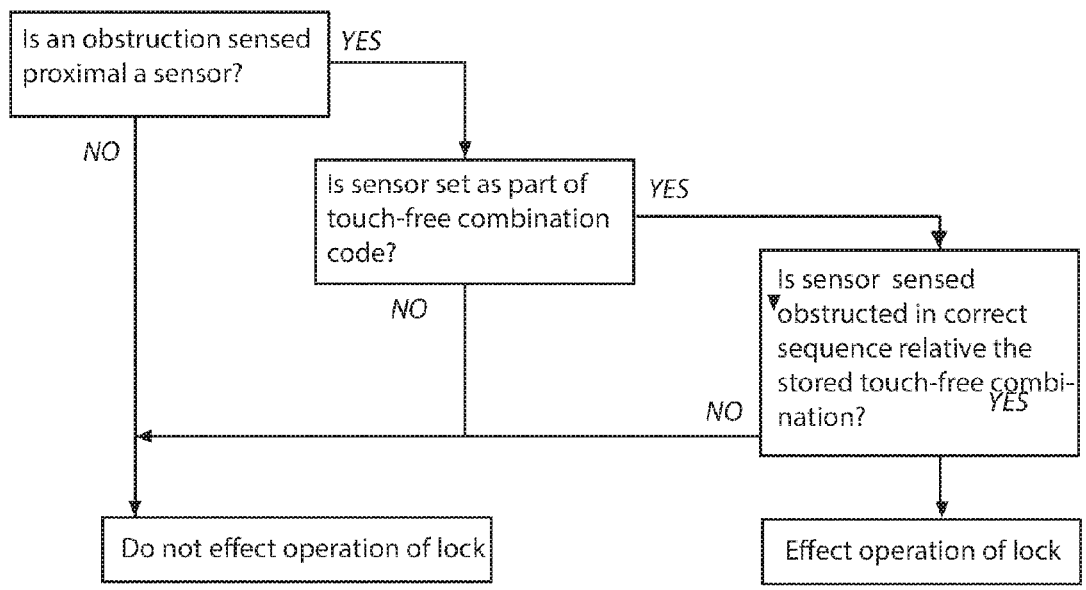
FIG. 6 is a logic diagram of an example embodiment of the method effecting operation of the touch-free combination lock.

With reference now to the drawings, and in particular FIGS. 1 through 6 thereof, example of the instant motion sensing combination lock employing the principles and concepts of the present motion sensing combination lock and generally designated by the reference numeral 10 will be described.

Referring to FIGS. 1 through 6 an example embodiment of the present motion sensing combination lock 10 is illustrated.

The present motion sensing combination lock 10 has been devised to enable touch-free operation of a lock. The term "touch-free" as used throughout this specification is taken to mean that no direct contact is required to manipulate operation of the lock.

The present motion sensing combination lock 10, therefore, includes a plurality of sensors 22 disposed upon a lock body 20, each of said plurality of sensors 22 disposed sensible of proximal obstructions, whereby position of a person's hand, or other proximal obstruction, is sensible by each of the plurality of sensors 22 to enable entry of a touch-free combination code sequentially applied between at least two of the plurality of sensors 22 whereby touch-free operation of the lock 10 is enabled.

The motion sensing combination lock 10 includes a lock body 20 disposed to engage a lock and secure entry through a door or restrict access to an area or an enclosure, as case may be. A plurality of sensors 22 is disposed upon the lock body 20, each of said plurality of sensors 22 sensible of obstructions proximally imposed thereto. In the preferred embodiment herein disclosed, the lock body 20 is contemplated to be circular and each of the plurality of sensors 22 is anteriorly disposed circumferentially upon the lock body 20.

A plurality of Light Emitting Diodes ("LEDs") 24 is disposed upon the lock body 20, each of said plurality of LEDs 24 illuminable to signal activation of an associated one of the plurality of sensors 22. Each of the plurality of LEDs 24 may signal illumination between a plurality of colors, whereby activation of a particular one of the plurality of sensors 22 is signaled by illumination of an associated LED 24 by position of an obstruction (such as a finger of a user, for example) most proximal thereto relative any other of the plurality of sensors 22, said LED 24 illuminating a first color when the sensor is activated and changing color when the successful touch-free combination code is entered or, alternately, changing color when an incorrect touch-free combination code is entered.

For example, each LED 24 may illuminate yellow signaling activation of each of the plurality of sensors 22. When the correct sequence of sensors 22 is activated by proximal obstruction sequentially applied between each of a relevant number of the plurality of sensors 22, the illuminated LEDs 24 may illuminate green, signaling access is granted and the lock 10 is unlocked. Alternatively, each LED 24 may illuminate yellow, for example, and at the unsuccessful completion of the relevant touch-free combination code, some or all of the plurality of LEDs 24 may illuminate red to signal access is not granted and the lock 10 is locked.

Thus, the plurality of LEDs 24 signal color changes to a user to communicate the status of the lock 10.

A manual mechanism 26 is included enabling manual operation of the lock 10 when desired. The manual mechanism 26 is included for use of the motion sensing combination lock 10 with public lavatories, for example, wherein users may have the option of touch-free operation of the lock 10.

The touch-free combination is settable to enable a specific motion to effect locking and unlocking of the motion sensing combination lock 10, for example, a sequential activation of each of the plurality of sensors 22 in a clockwise direction to effect locking of the lock 10, and a sequential activation of each of the plurality of sensors 22 in a counterclockwise direction to effect unlocking of the lock 10, each of which actions are readily accomplished by waving a hand proximal the lock body 20 in each of a clockwise and counterclockwise direction respectively.

Additional shapes or patterns are contemplated wherein a particular shape is drawn by a user's hand when operating the motion sensing combination lock 10. For example, tracing a pentagram, say, between five of the plurality of sensors 22 starting at a specific one of the plurality of sensors 22 and moving in a preset direction would enter a particular five point touch-free combination code. Moreover, each of the plurality of LEDs may be rendered numerically, or otherwise enumerated, whereby a particular numeric code is enterable to effect operation of the motion sensing combination lock 10. Additional examples should be obvious to anyone of any skill in the art.

In the preferred embodiment herein disclosed it is contemplated that each of the plurality of sensors 22 is sensible of proximal obstructions by means of infrared light emissions. When an object (such as a hand or finger of a user) is sensed within a maximum distance from each sensor 22, the sensor 22 activates a corresponding LED 24 to signal recognition of the obstruction directed at a particular sensor 22. The user is thus signaled to input the next action of the touch-free combination code.

Additional embodiments are contemplated that include optical sensing means, whereby a proximal obstruction is sensed by each of the plurality of sensors 22 optically recognizing the imposition of an obstruction, such as a hand or digit of a user, by proportional coverage of a filed of view.

Thus movement of any obstruction proximal the plurality of sensors 22 in a specific pattern between at least two of the plurality of sensors 22 enables touch-free entry of a touch-free combination code whereby the operation of unlocking and locking a lock 10 is enabled.

It is contemplated that a touch-free override code is included, said touch-free override code enabling programing of a new touch-free combination code for use with the motion sensing combination lock 10. For example, a user may enter the touch-free combination code twice to reprogram the motion sensing combination lock 10, as desired, or another touch-free override code may be required after the lock 10 is successfully opened.

The present motion sensing combination lock 10 may also include a switch sensor 28, disposed upon the lock body 20, whereby imposition of a proximal obstruction relative thereto switches the operation of the lock 10 from touch-free operation to manual operation. In the preferred embodiment herein disclosed, the switch sensor 28 is disposed in a depression upon the lock body 20 whereby imposition of a proximal obstruction is rendered only when a person places a finger tangentially relative the lock body 20 and proximal said switch sensor 28, as opposed to entry of the touch-free combination code, which requires proximal obstructions imposed anteriorly relative the lock body 20.

What is claimed is:

1. A motion sensing combination lock comprising a plurality of sensors sensible of proximal obstructions whereby movement of any obstruction proximal the plurality of sensors in a specific sequence between at least two of the plurality of sensors enables touch-free entry of a touch-free combination code whereby the operation of unlocking and locking the lock is enabled.

2. The motion sensing combination lock of claim 1 further comprising a plurality of Light Emitting Diodes disposed upon the lock body, each of said plurality of Light Emitting Diodes illuminable to signal activation of a corresponding one of the plurality of sensors.

3. The motion sensing combination lock of claim 2 further comprising a manual mechanism effecting locking and unlocking of the lock.

4. The motion sensing combination lock of claim 3 wherein the touch-free combination code is programmable subsequent entry of a touch-free override code.

5. The motion sensing combination lock of claim 4 wherein the plurality of sensors is disposed circumferentially around a circular lock body.

6. The motion sensing combination lock of claim 5 further comprising a switch sensor sensible of proximal obstruction whereby the lock is switchable between manual operation and touch-free operation.

7. A motion sensing combination lock comprising:
a lock body;
a plurality of sensors disposed upon the lock body, each of said plurality of sensors sensible of proximal obstructions;
a plurality of Light Emitting Diodes disposed upon the lock body, each of said plurality of Light Emitting Diodes illuminable to signal activation of an associated one of the plurality of sensors; and
a manual mechanism enabling manual operation of the lock;
wherein movement of any obstruction proximal the plurality of sensors in a specific pattern sequentially applied between at least two of the plurality of sensors enables touch-free entry of a touch-free combination code whereby the operation of unlocking and locking the lock is enabled.

8. The motion sensing combination lock of claim 7 wherein the plurality of sensors is sensible of proximal obstructions by emissions of infrared light.

9. The motion sensing combination lock of claim 7 wherein the plurality of sensors is sensible of proximal obstructions by optical recognition within a field of view.

10. A method of entering a touch-free combination code to a motion sensing combination lock comprising the steps of:
programming the motion sensing combination lock to accept a specific sequence of obstructions sensed proximal particular ones of a plurality of sensors disposed upon a lock body, said specific sequence of obstructions delimiting a touch-free combination code;
activating the motion sensing combination lock;
positioning a hand or digit of a hand proximal a relevant one of the plurality of sensors whereby the touch-free combination code is initiated;
moving said hand or digit to be proximal the next one of the plurality of sensors sequentially delimiting the touch-free combination code; and
moving said hand or digit in sequence proximal each of the sensors selectable to complete the touch-free combination code;
wherein entry of said touch-free combination code enables touch-free operation of the motion sensing combination lock.

\* \* \* \* \*